United States Patent
Furutani et al.

(10) Patent No.: US 6,477,109 B2
(45) Date of Patent: Nov. 5, 2002

(54) SYNCHRONOUS SEMICONDUCTOR MEMORY DEVICE ALLOWING DATA TO BE SATISFACTORILY REWRITTEN THEREIN

(75) Inventors: Kiyohiro Furutani; Yasuhiro Konishi, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 18 days.

(21) Appl. No.: 09/922,669

(22) Filed: Aug. 7, 2001

(65) Prior Publication Data

US 2001/0052602 A1 Dec. 20, 2001

Related U.S. Application Data

(62) Division of application No. 09/514,370, filed on Feb. 28, 2000, now Pat. No. 6,292,429.

(30) Foreign Application Priority Data

Aug. 30, 1999 (JP) .......................................... 11-242597

(51) Int. Cl.$^7$ ................................................. G11C 7/00
(52) U.S. Cl. ............. 365/233; 365/189.01; 365/230.06; 365/205
(58) Field of Search ........................... 365/233, 230.01, 365/189.01, 205, 230.06

(56) References Cited

U.S. PATENT DOCUMENTS

| | | | |
|---|---|---|---|
| RE34,463 E | 11/1993 | Konishi et al. | |
| 5,708,622 A | 1/1998 | Ohtani et al. | |
| 5,751,655 A | 5/1998 | Yamazaki et al. | |
| 5,754,481 A | 5/1998 | Yabe et al. | |
| 5,764,584 A | * 6/1998 | Fukiage et al. | 365/230.03 |
| 5,812,490 A | 9/1998 | Tsukude | |
| 5,815,462 A | 9/1998 | Konishi et al. | |
| 5,867,446 A | 2/1999 | Konishi et al. | |
| 5,892,730 A | 4/1999 | Sato et al. | |
| 5,903,514 A | * 5/1999 | Sawada | 365/233 |
| 5,991,223 A | * 11/1999 | Kozaru et al. | 365/230.03 |
| 5,991,233 A | * 11/1999 | Yu | 365/238.5 |
| 6,049,488 A | 4/2000 | Sawada | |
| 6,052,331 A | 4/2000 | Araki et al. | |
| 6,088,291 A | * 7/2000 | Fujioka et al. | 365/233 |
| 6,091,659 A | * 7/2000 | Watanabe et al. | 365/230.03 |
| 6,134,179 A | 10/2000 | Ooishi | |
| 6,172,935 B1 | 1/2001 | Wright et al. | |
| 6,246,620 B1 | * 6/2001 | Fujioka | 365/205 |
| 6,272,056 B1 | * 8/2001 | Ooishi | 365/200 |
| 6,279,116 B1 | * 8/2001 | Lee | 713/601 |
| 6,288,957 B1 | * 9/2001 | Katoh et al. | 365/201 |

* cited by examiner

Primary Examiner—Viet Q. Nguyen
(74) Attorney, Agent, or Firm—McDermott, Will & Emery

(57) ABSTRACT

In a SDRAM, there is introduced a control signal going active low following a passage of a predetermined period of time after a sense amplifier activation signal goes active high. When a signal going high during a burst period goes low and the control signal also goes low, a word line is dropped, non-selected low. As such, paired bit lines can have a potential difference sufficiently amplified to allow data to be satisfactorily rewritten into a memory cell.

3 Claims, 12 Drawing Sheets

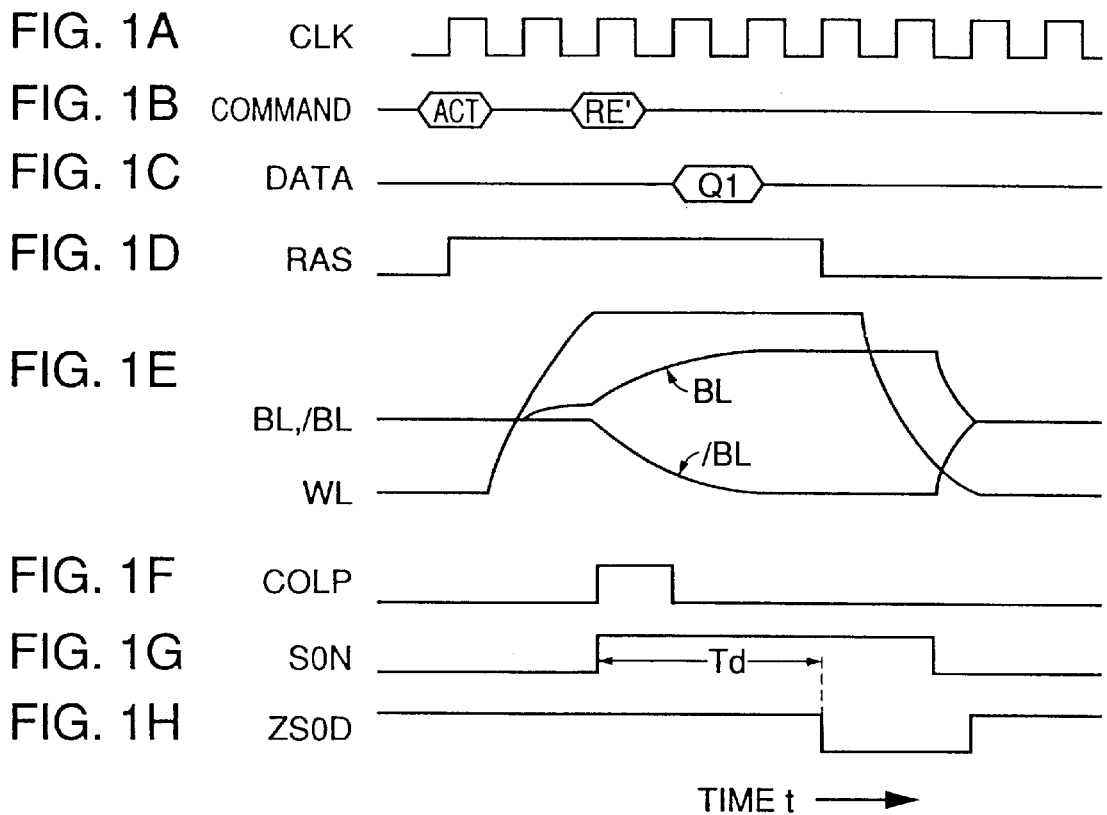
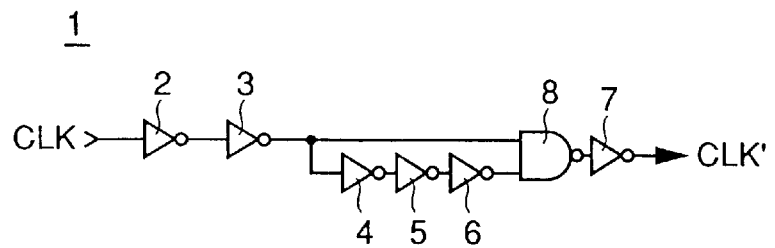

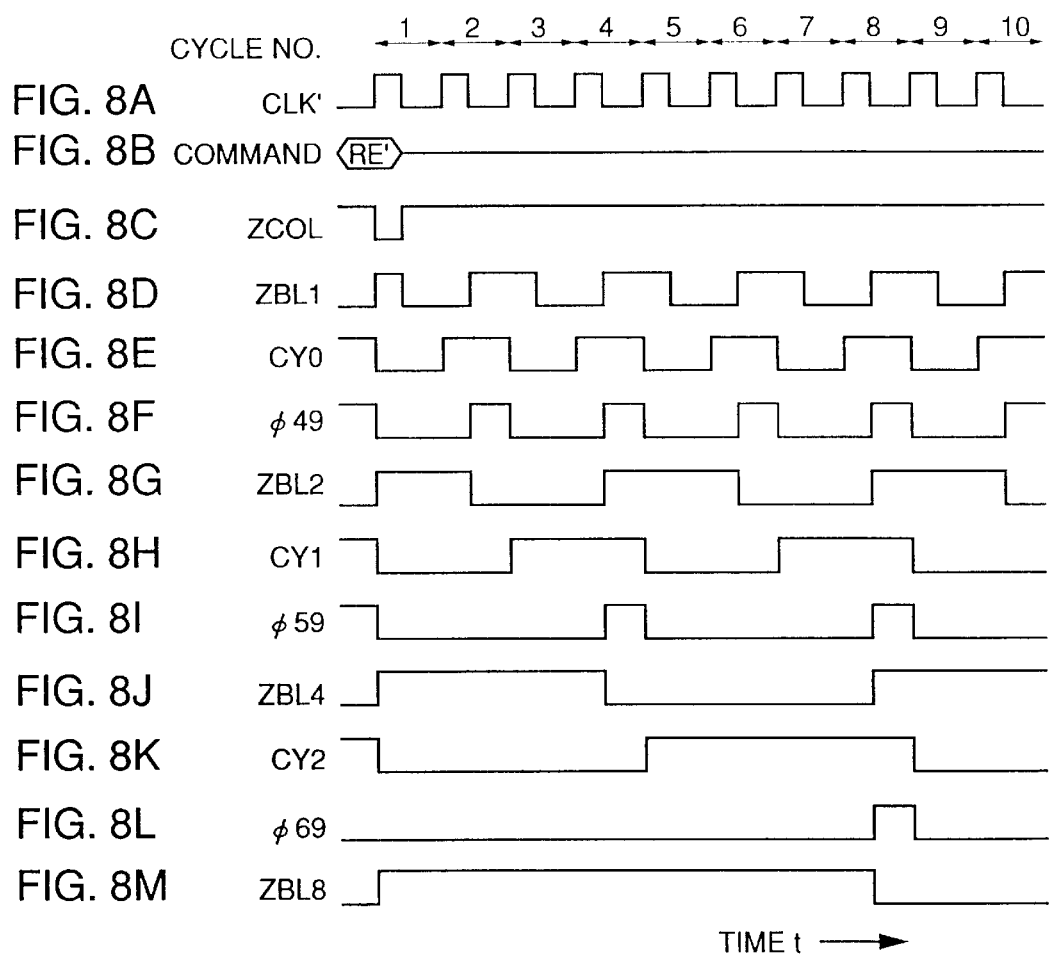

SYNCHRONOUS SEMICONDUCTOR MEMORY DEVICE ALLOWING DATA TO BE SATISFACTORILY REWRITTEN THEREIN

This application is a Divisional of application Ser. No. 09/514,370 filed Feb. 28, 2000 now U.S. Pat. No. 6,292,429.

BACKGROUND OF THE INVENTION

1. Field of the Invention

The present invention relates generally to synchronous semiconductor memory devices and in particular to synchronous semiconductor memory devices synchronized with a clock signal to allow data of a predetermined number of bits to be read/written from/to the same.

2. Description of the Background Art

Conventionally, as a semiconductor device using a memory cell which stores information by means of the electric charge held in a capacitor, a specification referred to as a synchronous dynamic random access memory (referred to as an SDRAM hereinafter) has been standardized and widely used as a computer's memory device and the like.

FIG. 11 is a block diagram showing a schematic configuration of a conventional SDRAM. In FIG. 11 the SDRAM includes a clock buffer 151, a control signal buffer 152, an address buffer 153, a mode register 154, a control circuit 155, four memory arrays 156–159 (banks #0 #3), and an I/O buffer 160.

Clock buffer 15 is activated in response to an external control signal CKE to transmit an external clock signal CLK to control signal buffer 152, address buffer 153 and control circuit 155. Control signal buffer 152 is synchronized with external clock signal CLK from dock buffer 151 to latch and feed external control signals /CS, /RAS, /CAS, /WE, DQM to control circuit 155. Address buffer 153 is synchronized with external clock signal CLK from clock buffer 151 to latch and feed external address signals A0–Am, wherein m represents an integer no less than zero, and bank select signals BA0, BA1 to control circuit 155.

Mode register 154 stores a mode designated by external address signals A0–Am and other signals and outputs an internal command signal corresponding to the stored mode. Memory arrays 156–159 each have a plurality of memory cells arranged in rows and columns and each storing 1-bit data. The plurality of memory cells are previously divided into groups each having n+1 memory cells, wherein n represents an integer no less than zero.

Control circuit 155 responds to signals from clock buffer 151, control signal buffer 152, address buffer 153 and mode register 154 by producing various internal signals to generally control the SDRAM. Control circuit 155 in write and read operations responds to bank select signals BA0, BA1 by selecting any of four memory arrays 156–159 and to address signals A0–Am by selecting n+1 memory cells from the selected memory array. The selected n+1 memory cells are activated to be coupled with I/O buffer 160.

I/O buffer 160 in write operation feeds externally input data D0–Dn to the selected n+1 memory cells and in read operation externally outputs data Q0–Qn read from the n+1 memory cells.

FIG. 12 is a circuit block diagram showing a configuration of a portion of the FIG. 11 memory array 156 and a portion associated therewith. In FIG. 12, memory array 156 includes a plurality of memory cells MCs arranged in rows and columns, a word line WL provided for each row of memory cells, a pair of bit lines BL and /BL provided for each column of memory cells. Memory cell MC includes an n channel MOS transistor Q for access, and a capacitor C for information storage.

Each word line WL has one end connected to a row decoder (not shown) included in control circuit 155. The row decoder is responsive to a row address signal produced from address signals A0 to Am for selecting any of the plurality of word lines WLs to set word line WL to a selected level or a high level.

At one end of each pair of bit lines BL and /BL, an equalizer EQ is arranged for equalizing paired bit lines BL and /BL to a bit line potential VBL (=VCC/2) before memory cell MC is selected. Equalizer EQ includes an n channel MOS transistor 161 connected between bit lines BL and /BL, an n channel MOS transistor 162 connected between bit line BL and a node N162, and n channel MOS transistor 163 connected between bit line /BL and node N162. MOS transistors 161–163 have their respective gates receiving a bit line equalization signal BLEQ. Node N162 receives bit line potential VBL.

Between paired bit lines BL and /BL a sense amplifier SA is arranged for amplifying a slight potential difference appearing between bit lines BL and /BL after memory cell MC is selected. Sense amplifier SA includes an n channel MOS transistor 164 connected between bit line BL and a node N164, and n channel MOS transistor 165 connected between bit line /BL and node N164, a p channel MOS transistor 166 connected between bit line BL and a node N166, and a p channel MOS transistor 167 connected between bit line /BL and node N166. MOS transistors 164, 166 have their respective gates both connected to bit line /BL and MOS transistors 165, 167 have their respective gates both connected to bit line BL. Nodes N164 and N166 are connected via n and p channel MOS transistors 168 and 169 to a line for a ground potential GND and a line for a power supply potential VCC, respectively. N and p channel MOS transistors 168 and 169 have their respective gates receiving sense amplifier activation signals SON and ZS0P, respectively, output from control circuit 155.

Bit lines BL and /BL have their one ends connected via a column select gate CSG to one end of a pair of data input/output lines 10 and /IO. Column select gate CSG includes an n channel MOS transistor 171 connected between bit line BL and data input/output line IO, and an n channel MOS transistor 171 connected between one end of bit line /BL and data input/output line /IO. n channel MOS transistors 170, 171 have their respective gates connected to one end of a column select line CSL.

Each column select line CSL has the other end connected to a column decoder (not shown) included in control circuit 155. The column decoder is responsive to a column address signal produced from address signals A0 to Am for selecting any of the plurality of column select lines CSLs to set column select line CSL to a selected level or a high level. The number of the FIG. 12 circuits is equal to that of bits of data that can be simultaneously input/output, i.e., n+1.

FIG. 13 is a time chart representing a data read operation of the SDRAM shown in FIGS. 11 and 12. Assuming that memory array 156 is selected, description will now be made only of a single data input/output terminal. Initially, an active command ACT (/RAS of low level, /CAS of high level, /CS of low level, /WE of high level) and a row address signal are input. In FIG. 12, bit line equalization signal BLEQ goes inactive low, the equalizer's n channel MOS transistors 161–163 turn off, and equalizing paired bit lines BL and /BL is stopped. Simultaneously, row activation signal RAS goes active high and word line WL corresponding to a row address signal is raised selected high. Thus, memory cell MC connected to word line WL has n channel MOS transistor Q turned on and bit lines BL and /BL have a potential slightly varied depending on the amount of charge of capacitor C of activated memory cell MC.

Then, sense amplifier activation signal S0N goes active high and sense amplifier activation signal ZS0P also goes active low and sense amplifier SA is activated. When bit line BL has a potential slightly higher than bit line /BL, MOS transistors 165, 166 have a resistance smaller than MOS transistors 164, 167 so that the bit line BL potential is pulled high and the bit line /BL potential is pulled low. When bit line BL has a potential slightly lower than bit lines /BL, MOS transistors 165, 166 has a resistance larger than MOS transistors 164, 167 so that the bit line BL potential is pulled low and the bit line /BL potential is pulled high.

Then a read command RE (/RAS is high, /CAS is low, /CS is low, /WE is high) and a top column address signal are input. In the initial cycle, column select line CSL1 corresponding to the top column address signal is raised selected high and column select gate CSG associated with the column select line CSL1 has its n channel MOS transistors 170, 171 turned on and the pair of bit lines BL, /BL associated with the column select line CSL1 are coupled with the pair of data input/output lines IO, /IO. The data transmitted on the pair of data input/output lines IO, /IO is externally output via I/O buffer 160. Thereafter, by a burst length (in the figure it is two), following the top column address signal a column address signal is produced internal to the SDRAM and column select line CSL corresponding to the column address signal is selected and data is output from the column. It should be noted that in FIG. 13 a signal COLP goes high during a burst period.

Finally, a precharge command PRE (/RAS is low, /CAS is high, /CS is low, /WE is low) is input. Responsively, row activation signal RAS goes low and word line WL is pulled non-selected low. Thus, memory cell MC connected to word line WL has n channel MOS transistor Q turned off and a potential of bit lines BL, /BL amplified by sense amplifier SA to power supply potential VCC or ground potential GND is held in capacitor C of memory cell MC. Then, bit line equalization signal BLEQ is raised active high and the equalizer's n channel MOS transistors 161–163 turn on and bit lines BL, /BL are equalized to bit line potential VBL. Thus the preparation for the next data read operation completes. As such, in the SDRAM, active command ACT, read command RE and precharge command PRE can be repeatedly applied to read data from memory cells of different rows.

In the SDRAM, a read command RE' with an auto-precharge function is standardized, as shown in FIG. 14, to simplify the procedure of the data read operation thereof. With read command RE', a precharge operation is automatically provided without inputting precharge command PRE when a read operation is complete.

In write operation, as shown in FIG. 12, column select line CSL corresponding to a column address signal is raised selected high and column select gate CSG associated with the column select line CSL conducts and the pair of bit lines BL, /BL is coupled with the pair of data input/output lines IO, /IO. Then, according to read data, via data input/output lines IO, /IO one of bit lines BL, /BL is set high and the other is set low and word line WL corresponding to a row address signal is also raised selected high for a predetermined period of time and bit line BL or /BL has its potential stored in capacitor C of memory cell MC. For a column which is not coupled with the pair of data input/output lines IO, /IO, as in read operation, paired bit lines BL, /BL are stopped from being equalized, word line WL is raised high, sense amplifier SA is activated, word line WL falls low and paired bit lines BL, /BL are equalized, and data is rewritten into memory cell MC.

Furthermore, data may be written using either an active command, a write command and a precharge command, or an active command and a write command with the auto-precharge function.

In a conventional SDRAM, however, when read command RE with the auto-precharge function is input a precharge operation starts at the cycle following that at which a read operation completes. As such if, particularly with a burst length of one applied, read command RE' is input at an earlier timing, then word line WL falls low before sense amplifier SA sufficiently amplifies a potential difference between paired bit lines BL and /BL, as shown in FIG. 15, so that sufficient charge cannot be written into capacitor C of memory cell MC. Thus read command RE' cannot be input early to obtain output data Q1 early. This also applies to inputting a write command with the auto-precharge function.

Therefore, a main object of the present invention is to provide a synchronous semiconductor memory device capable of satisfactorily rewriting data into a memory cell in data read/write operation.

Briefly speaking of the present invention, in response to a predetermined first period of time elapsing following a low select circuit setting a word line to a selected level and in response to a completion of the selecting said bit line pairs via which data are read/written in accordance with the read/write command, a signal generation circuit responsively applies to the row select circuit a reset signal for setting the word line to a non-selected level. As such, by appropriately setting the first period of time, a potential difference of paired bit lines can be sufficiently amplified before a word line is set to the non-selected level, to allow data to be sufficiently rewritten into a memory cell. Furthermore, if data is read earlier, data will not be insufficiently rewritten, so that the data can be read rapidly.

Preferably, the row select circuit is activated in response to an active command being input, a sense amplifier is activated following a second predetermined period of time after the active command is input, the column select circuit is activated in response to a read/write command being input after the active command is input, and the signal generation circuit applies the reset signal to the row select circuit in response to a third predetermined period of time elapsing after the sense amplifier is activated and in response to a completion of the selecting said bit line pairs via which data are read/written in accordance with the read/write command. As such, data can be rewritten into a memory cell further accurately.

Still preferably, there can also be provided an equalizer equalizing each pair of bit lines to a predetermined potential in response to the row select circuit setting a word line to the non-selected level. As such, data can be accurately read from an activated memory cell.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A–1H are time plots representing a data read operation of an SDRAM of one embodiment of the present invention.

FIG. 2 is a circuit diagram showing a configuration of a clock buffer circuit included in the SDRAM described in conjunction with FIGS. 1A–1H.

FIGS. 8A–8M are time plots representing an operation of the counter shown in FIGS. 5A–7.

DESCRIPTION OF THE PREFERRED EMBODIMENTS

Figure 15:
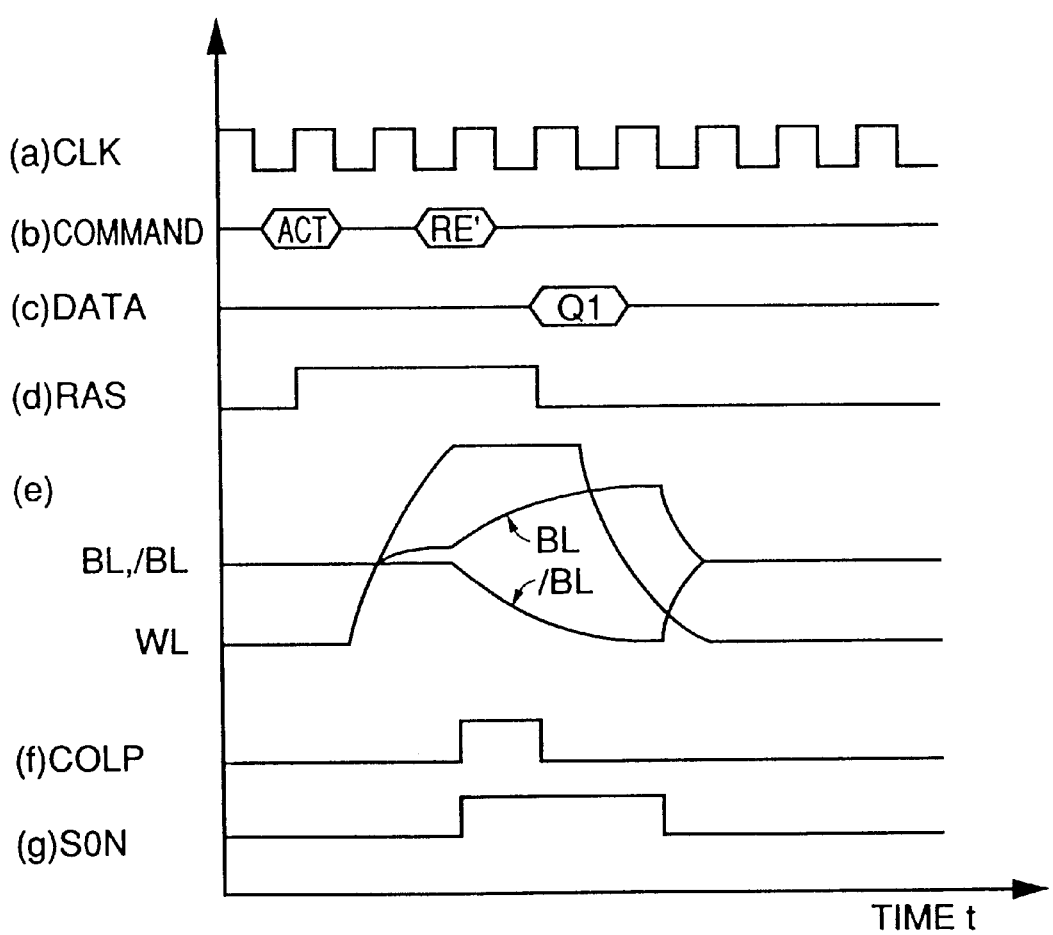
FIG. 15 is time plots for illustrating a disadvantage in the FIG. 14 data read operation.

FIGS. 1A–1H are time plots representing a data read operation of an SDRAM of one embodiment of the present invention, as compared with FIG. 15.

Referring to FIGS. 1A–1H, the SDRAM initially receives an active command (/RAS is low, /CAS is high, /CS is low, /WE is high) and a row address signal. Responsively, a row activation signal RAS goes active high, and a word line WL corresponding to the row address signal is raised, selected high. Thus, a memory cell MC connected to word line WL is activated and a potential of bit lines BL, /BL varies slightly.

Then, a sense amplifier SA is activated to start and amplify a potential difference between paired bit lines BL and /BL, and a read command with an auto-precharge function and a top column address signal are also input. A signal COLP goes high only for a burst period (in the figure, with a burst length of one). In the subsequent cycle there is output data Q1 read on bit lines BL, /BL corresponding to the top column address signal. The operation so far is the same as conventional.

Conventionally, when signal COLP goes low, signal RAS also goes low. In the present embodiment, there is introduced a signal ZS0D going active low when a predetermined period of time Td elapses after sense amplifier activation signal SON goes active high, and signal RAS goes low in response to signal COLP going low and signal ZS0D also going low. As such, paired bit lines BL and /BL can have a potential difference therebetween sufficiently amplified before word line WL goes low.

When signal RAS goes low, word line WL falls, non-selected low, and the current potential of bit line BL or /BL is written into the capacitor of memory cell MC. Then, bit lines BL and /BL are equalized to bit line potential VPL= VCC/2 to complete the preparation for the next data read operation.

As such, output data Q1 can be obtained earlier and data can also be sufficiently rewritten into memory cell MC. Description will now be made in further detail of a circuit configuration for providing this data read operation.

FIG. 2 is a circuit diagram showing a configuration of a clock buffer circuit 1. In FIG. 2, clock buffer circuit 1 includes inverters 2 to 7 and an NAND gate 8. An external clock signal CLK is input via inverters 2, 3 to NAND gate 8 at one input node and also via inverters 2 to 6 to NAND gate 8 at the other input node. A signal output from NAND gate 8 is inverted by inverter 7 to serve as an internal clock signal CLK'.

When external clock signal CLK has a low level, inverter 3 outputs a signal of low level, inverter 6 outputs a signal of high level and internal clock signal CLK' has a low level. When external clock signal CLK rises from low to high, after a delay time of inverters 2, 3 elapses an output from inverter 3 goes high and internal clock signal CLK' goes high. Furthermore, after a delay time of inverters 4 to 6 elapses an output from inverter 6 falls low and internal clock signal CLK' goes low. As such, internal clock signal CLK' has a pulse width corresponding to the delay time of inverters 4 to 6.

Figure 3:
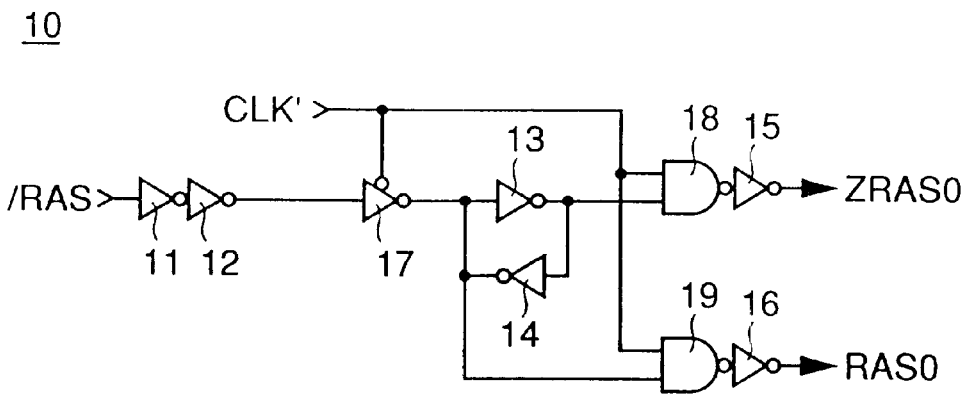
FIG. 3 is a circuit diagram showing a configuration of an input signal latch circuit included in the SDRAM described in conjunction with FIGS. 1A–1H.

FIG. 3 is a circuit diagram showing a configuration of an input signal latch circuit 10. In FIG. 3, input signal latch circuit 10 includes inverters 11 to 16, a clocked inverter 17, and NAND gates 18, 19. External control signal /RAS is input via inverters 11, 12 to clocked inverter 17.

Figure 4:
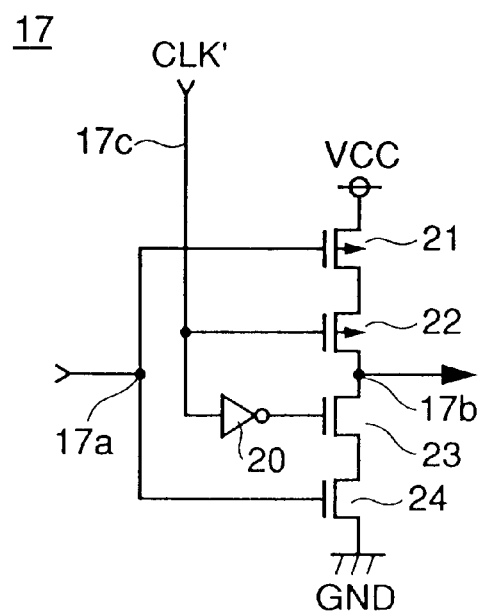
FIG. 4 is a circuit diagram showing a configuration of the clocked inverter shown in FIG. 3.
Figure 5A:
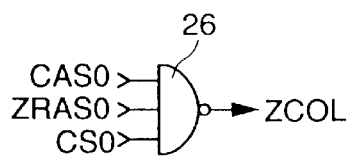
FIGS. 5A–5E are circuit diagrams showing a configuration of a portion of a counter included in the SDRAM described in conjunction with FIGS. 1A–1H.
Figure 5B:
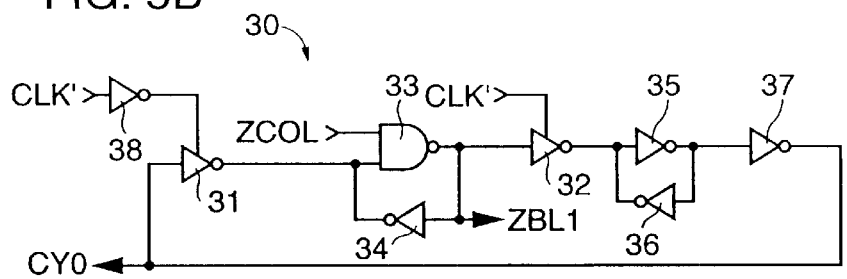
Figure 5C:
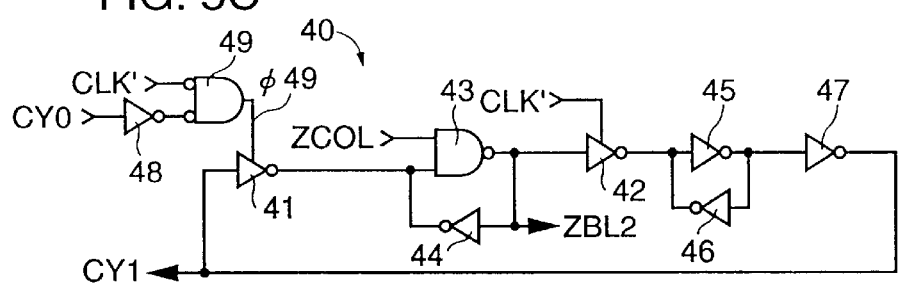
Figure 5D:
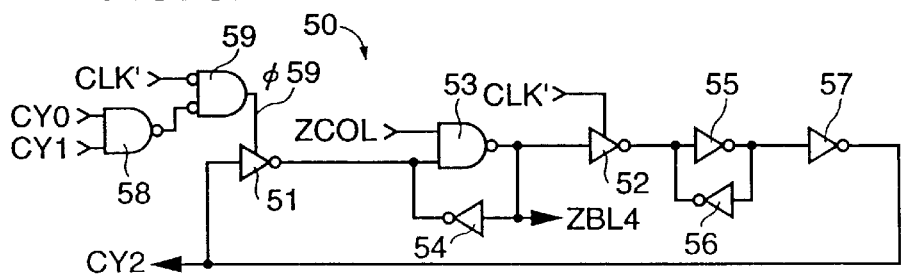
Figure 5E:
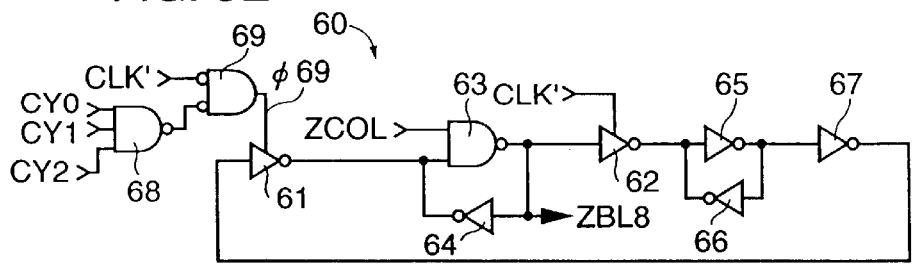

As shown in FIG. 4, clocked inverter 17 includes an inverter 20, a p channel MOS transistors 21, 22, and n channel MOS transistors 23, 24.

MOS transistors 21–24 are connected in series between a line for a power supply potential VCC and that for a ground potential GND. MOS transistors 21 and 24 have their respective gates both connected to an input node 17a. A node between MOS transistors 22 and 23 serves as an input node 17b. P channel MOS transistor 22 has its gate connected to a control node 17c, and inverter 20 is connected between control node 17c and the gate of n channel MOS transistor 23. When control node 17c is of low level, MOS transistors 22, 23 turn on to activate clocked inverter 17. When control node 17c is of high level, MOS transistors 22, 23 turn off to inactivate clocked inverter 17.

An output from clocked inverter 17 is input via inverter 13 to NAND gate 18 at one input node and also to NAND gate 19 at one input node. Inverters 13 and 14 are connected in antiparallel to form a latch circuit. Internal clock signal CLK' is input to clocked inverter 17 at control node 17c and also to NAND gates 18, 19 at their respective other input nodes. Signals output from NAND gates 18, 19 are inverted by inverters 15, 16 to be provided as internal control signals ZRAS0, RAS0, respectively.

When internal clock signal CLK' has a low level, clocked inverter 17 is activated and internal control signals ZRAS0, RAS0 are both fixed high, while external control signal /RAS has its level taken into the latch circuit formed by inverters 13, 14. When internal clock signal CLK' goes from low to high, docked inverter 17 is inactivated and external control signal /RAS has its level latched by the latch circuit formed by inverters 13, 14.

An output from inverter 13 is output as signal ZRAS0 via NAND gate 18 and inverter 15, and that from inverter 14 is output as signal RAS0 via NAND gate 19 and inverter 16. Thus, when external control signal /RAS has a low level at a rising edge of internal clock signal CLK', signals ZRAS0 and RAS0 go low and high, respectively. When external control signal /RAS has a high level at a rising edge of internal clock signal CLK', signals ZRAS0 and RAS0 go high and low, respectively.

Input signal latch circuit 10 is provided for each of external control signals /CS, /RAS, /CAS, /WE, DQM, bank select signals BA0, BA1, and external address signals A0 to Am.

FIGS. 5A–7 are circuit diagrams showing a configuration of a counter for producing a signal COLP indicative of a burst period, and FIG. 8 is time plots representing an operation of the FIG. 8 counter. In FIGS. 5A–5E, the counter includes an NAND gate 26 and signal generation circuits 30, 40, 50, 60. NAND gate 26 receives internal control signals CAS0, ZRAS0 and CS0 and outputs a signal ZCOL. When read command RE' (/RAS is high, /CAS is low, /CS is low, /WE is high) or a write command (/RAS is high, /CAS is low, /CS is low, /WE is low) is input, internal control signals CAS0, ZRAS0, CS0 all go high and signal ZCOL goes low.

Figure 6:
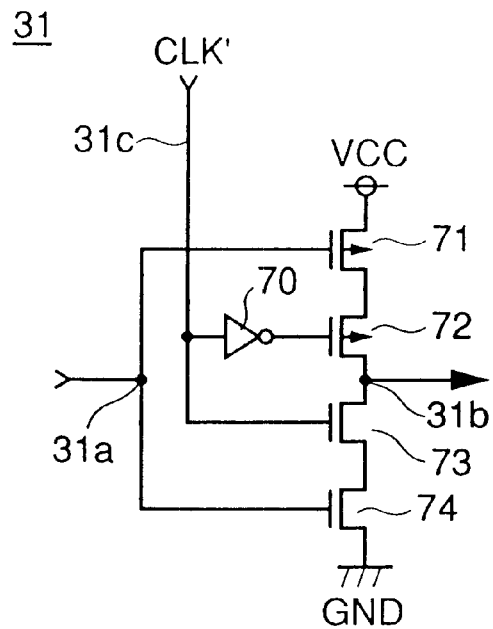
FIG. 6 is a circuit diagram showing a configuration of the docked inverters shown in FIGS. 5A–5E.
Figure 7:
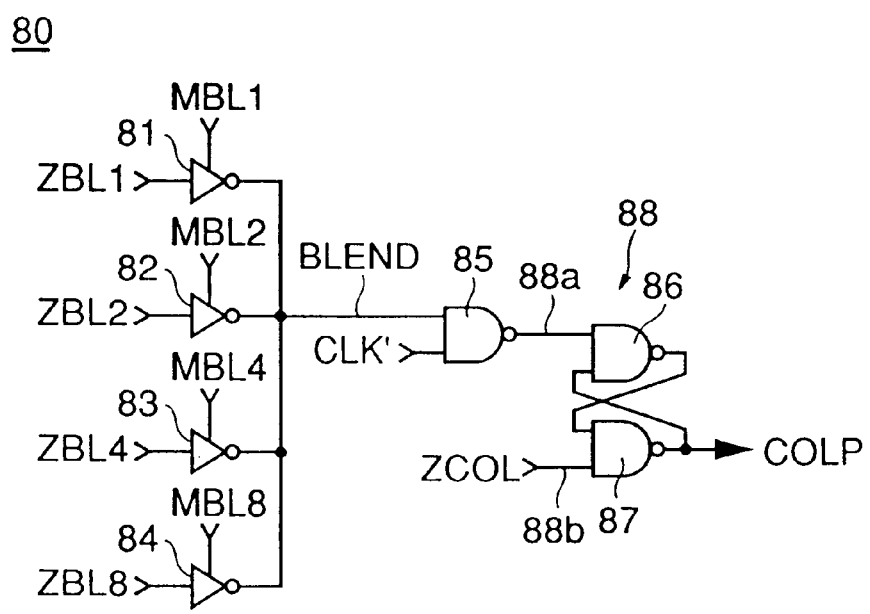
FIG. 7 is a circuit diagram showing a configuration of a remaining portion of the counter included in the SDRAM described in conjunction with FIGS. 1A–1H.

Signal generation circuit 30 includes clocked inverters 31, 32, an NAND gate 33, and inverters 34–38. As shown in FIG. 6, clocked inverter 31 includes an inverter 70, p channel MOS transistors 71, 72, and n channel MOS transistors 73, 74. MOS transistors 71–74 are connected in series between a line for power supply potential VCC and that for ground potential GND. MOS transistors 71 and 74 have their respective gates both connected to an input node 31a. A node between MOS transistors 72 and 73 serves as an output node 31b. N channel MOS transistor 73 has its gate connected to a control node 31c, and inverter 70 is connected between control node 31c and the gate of p channel MOS transistor 72.

When control node 31c is of high level, MOS transistors 72, 73 turn on to activate clocked inverter 31. When control node 31c is of low level, MOS transistors 72, 73 turn off to inactivate clocked inverter 31. Clocked inverter 32 is identical in configuration to clocked inverter 31. Internal clock signal CLK is input via inverter 38 to clocked inverter 31 at control node 31c and is also input directly to clocked inverter 32 at a control node.

NAND gate 33 receives signal ZCOL and an output from clocked inverter 31. NAND gate 33 outputs a signal ZBL1 which is in turn input via clocked inverter 32 and inverters 35, 37 to clocked inverter 31. Inverter 34 is connected between an output node of NAND gate 33 and an output node of inverter 31. Inverters 35 and 36 are connected in antiparallel to form a latch circuit. An output from inverter 37 serves as a signal CY0.

As represented in FIGS. 8A–8E, when read command RE' is applied in cycle 1 at a rising edge of internal clock signal CLK', signal ZCOL goes low in cycle 1 only during a high level period of internal clock signal CLK, and signal generation circuit 30 is reset.

When signal ZCOL drops low, signal ZBL1 goes high signal CY0 also drops low. After signal ZCOL is driven high, signal ZBL1 is inverted whenever internal clock signal CLK' falls, and signal CY0 is inverted whenever internal clock signal CLK' rises. Thus signals ZBL1 and CY0 have a period twice internal clock signal CLK' and a duty ratio of 50%.

Signal generation circuit 40 includes clocked inverters 41, 42, an NAND gate 43, inverters 44–48, and an NOR gate 49. NAND gate 43 outputs a signal ZBL2 which is in turn input via clocked inverter 42, inverters 45, 47 and docked inverter 41 to NAND gate 43 at one input node. NAND gate 43 has the other input node receiving signal ZCOL. Inverter 44 is connected between an output node of NAND gate 43 and one input node thereof Inverters 45 and 46 are connected in antiparallel to form a latch circuit. Internal clock signal CLK is input to NOR gate 49 at one input node and is also input directly to clocked inverter 42 at a control node. Signal CY0 is input via inverter 48 to NOR gate 49 at the other input node. NOR gate 49 outputs a signal φ49 which is in turn input to clocked inverter 41 at an control node.

As shown in FIG. 8F, signal φ49, a signal of a logical product of a signal complementary to internal clock signal CLK' and signal CY0, goes high in each of cycles 2, 4, 6, . . . , when internal dock signal CLK' is held low. Signal ZBL2 is, as shown in FIG. 8G, inverted when signal φ49 rises from low to high. Signal CY1 is, as shown in FIG. 8H, inverted when signal φ49 falls from high to low.

Signal generation circuit 50 includes clocked inverters 51, 52, NAND gates 53, 58, inverters 54–57, and an NOR gate 59. NAND gate 53 outputs a signal ZBL4 which is in turn input via clocked inverter 52, inverters 55, 57 and clocked inverter 51 to NAND gate 53 at one input node. NAND gate 53 has the other input node receiving signal ZCOL. Inverter 54 is connected between an output node of NAND gate 53 and one input node thereof. Inverters 55 and 56 are connected in antiparallel to form a latch circuit. Internal clock signal CLK' is input to NOR gate 59 at one input node and also to clocked inverter 52 at a control node. NAND gate 58 receives signals CY0, CY1 and outputs a signal which is in turn input to NOR gate 59 at the other input node. NOR gate 59 outputs a signal φ59 which is in turn input to clocked inverter 51 to a control node.

As shown in FIG. 8I, signal φ59, a signal of a logical product of a signal complementary to internal clock signal CLK' and signals CY0 and CY1, goes high in each of cycles 4, 8, . . . , when internal clock signal CLK' is held low. Signal ZBL4 is, as shown in FIG. 8J, inverted in response to a rising edge of signal φ59. Signal CY2 is, as shown in FIG. 8K, inverted in response to a falling edge of signal φ59.

Signal generation circuit 60 includes clocked inverters 61, 62, NAND gates 63, 68, inverters 64–67, and an NOR gate 69. NAND gate 63 outputs a signal ZBL8 which is in turn input via clocked inverter 62, inverters 65, 67 and clocked inverter 61 to NAND gate 63 at one input node. NAND gate 63 has the other input node receiving signal ZCOL. Inverter 64 is connected between an output node of NAND gate 63 and one input node thereof. Inverters 65 and 66 are connected in antiparallel to form a latch circuit. Internal clock signal CLK' is input to NOR gate 69 at one input node and also to clocked inverter 62 at a control node. NAND gate 68 receives signals CY0, CY, CY2 and outputs a signal which is in turn input to NOR gate 69 at the other input node. NOR gate 69 outputs a signal φ69 which is in turn input to clocked inverter 61 at a control node.

As shown in FIG. 8L, signal φ69, a signal of a logical product of a signal complementary to internal clock signal CLK' and signals CY0, CY1, CY2, goes high in each of cycles 8, 16, . . . , when internal clock signal CLK' is held low. Signal ZBL8 is, as shown in FIG. 8M, inverted in response to a rising edge of signal φ69.

Thus, signals ZBL1, ZBL2, ZBL4, ZBL8 fall from high to low in response to high to low transition of internal clock signal CLK' at the first, second, fourth and eight cycles, respectively, after signal ZCOL resets the signals. Signals ZBL1, ZBL2, ZBL4, ZBL8 are applied to the FIG. 7 signal generation circuit 80.

Signal generation circuit 80 includes clocked inverters 81–84 and NAND gates 85–87, and NAND gates 86, 87 configure a flip-flop 88. Signals ZBL1, ZBL2, ZBL4, ZBL8 are respectively input to clocked inverters 81, 82, 83, 84 having their respective outputs which are in turn input to NAND gate 85 at one input node. Clocked inverters 81, 82, 83, 84 have their respective nodes respectively receiving signals MBL1, MBL3, MBL4, MBL8 going high for burst lengths of 1, 2, 4, 8, respectively. Internal clock signal CLK' is input to NAND gate 85 at the other input node and NAND gate 85 outputs a signal which is in turn input to flip-flop 88 at a reset terminal 88a. Signal ZCOL is input to flip-flop 88 at a set terminal 88b and flip-flop 88 outputs a signal serving as signal COLP.

A signal BLEND appearing at one input node of NAND gate 85 goes from low to high in response to high to low transition of internal clock signal CLK' in each of cycles 1, 2, 4, 8 for burst lengths of 1, 2, 4, 8, respectively. As such, signal COLP for burst lengths of 1, 2, 4, 8 goes high in response to a rising edge of signal ZCOL and goes low in cycles 2, 3, 5, 9 in response to a rising edge of internal clock signal CLK'. Thus, as shown in FIG. 1F, signal COLP is held high only during the burst period.

FIGS. 9A–9C and 10 are circuit diagrams showing a configuration of a signal generation circuit for producing row activation signal RAS. When signal RAS rises from low to high, word line WL is raised, selected high, and when signal RAS falls from high to low, word line WL drops, non-selected low and precharge operation is also started.

Figures 9A, 9B, 9C:
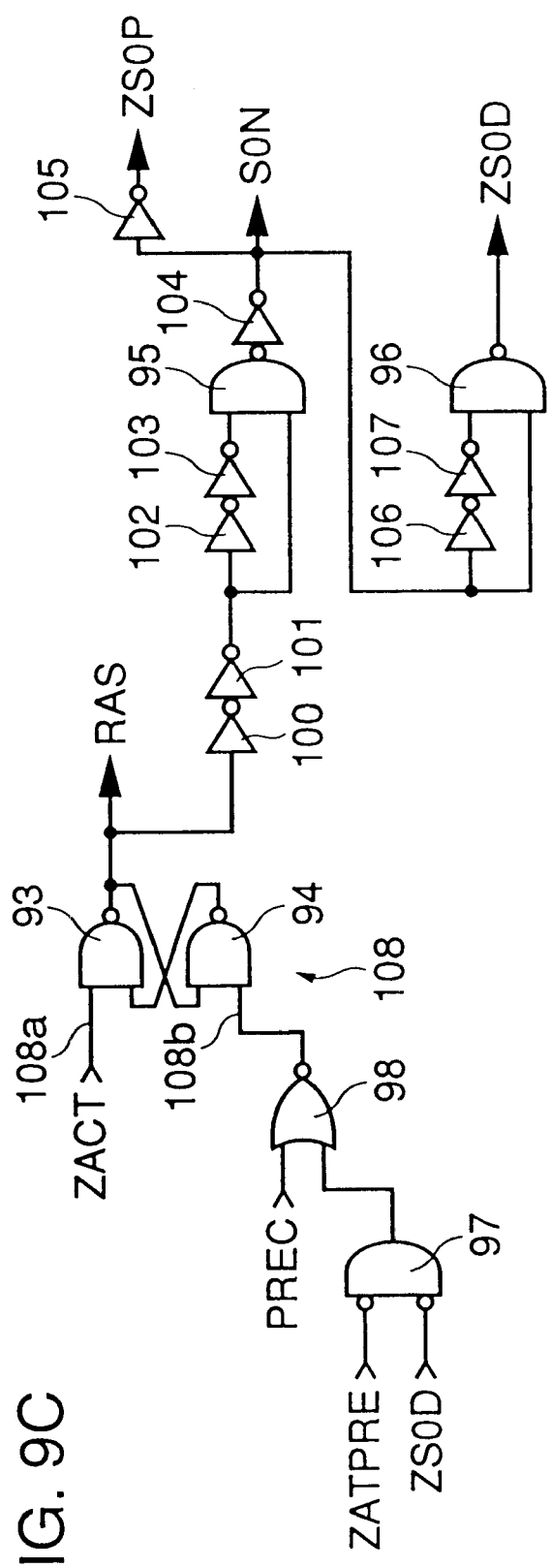
FIGS. 9A–9C are circuit diagrams showing configurations of portions of a signal generation circuit included in the SDRAM described in conjunction with FIGS. 1A–1H.

In FIGS. 9A–9C, the signal generation circuit includes NAND gates 91–96, NOR gates 97, 98 and inverters 99–107, and NAND gates 93, 94 configure a flip-flop 108. NAND gate 91 receives internal control signals CS0, ZWE0, RAS0, ZCAS0 and outputs a signal ZACT which goes active low when active command ACT (/RAS is low, /CAS is high, /CS is low, /WE is high) is input.

NAND gate 92 receives internal control signals CS0, RAS0, W0O, ZCAS0. A signal output from NAND gate 92 is inverted by inverter 99 and provided as a signal PREC which goes active high when precharge command PRE (/RAS is low, /CAS is high, /CS is low, /WE is low) is input.

A signal ZACT is input to flip-flop 108 at a set terminal 108a. Signal PREC is input to NOR gate 98 at one input node. NOR gate 97 receives signals ZATPRE, ZS0D and outputs a signal which is in turn input to NOR gate 98 at the other input node. NOR gate 98 outputs a signal which is in turn input to flip-flop 108 at a reset terminal 108b. Flip-flop 108 outputs a signal serving as signal RAS.

Thus, signal RAS goes high when signal ZACT goes low, and signal RAS goes low when signal PREC goes high or signals ZATPRE and ZS0D both go low.

Signal RAS is input via inverters 100–103 to NAND gate 95 at one node and also via inverters 100, 101 to NAND gate 95 at the other input node. A signal output from NAND gate 95 is inverted by inverter 104 and thus provided as a signal S0N, which is in turn inverted by inverter 105 and thus provided as a signal ZS0P. Signal S0N is, as shown in FIG. 1G, a delayed version of signal RAS. Signal S0N is input via inverters 106, 107 to NAND gate 96 at one input node and also directly to NAND gate 96 at the other input node. NAND gate 96 outputs a signal serving as a signal ZS0D, which is, as shown in FIG. 1H, a signal obtained by delaying a fall of an inverted version of signal S0N by a predetermined period of time Td set to be a time sufficient for amplifying a potential difference between paired bit lines BL and /BL.

Figure 10:
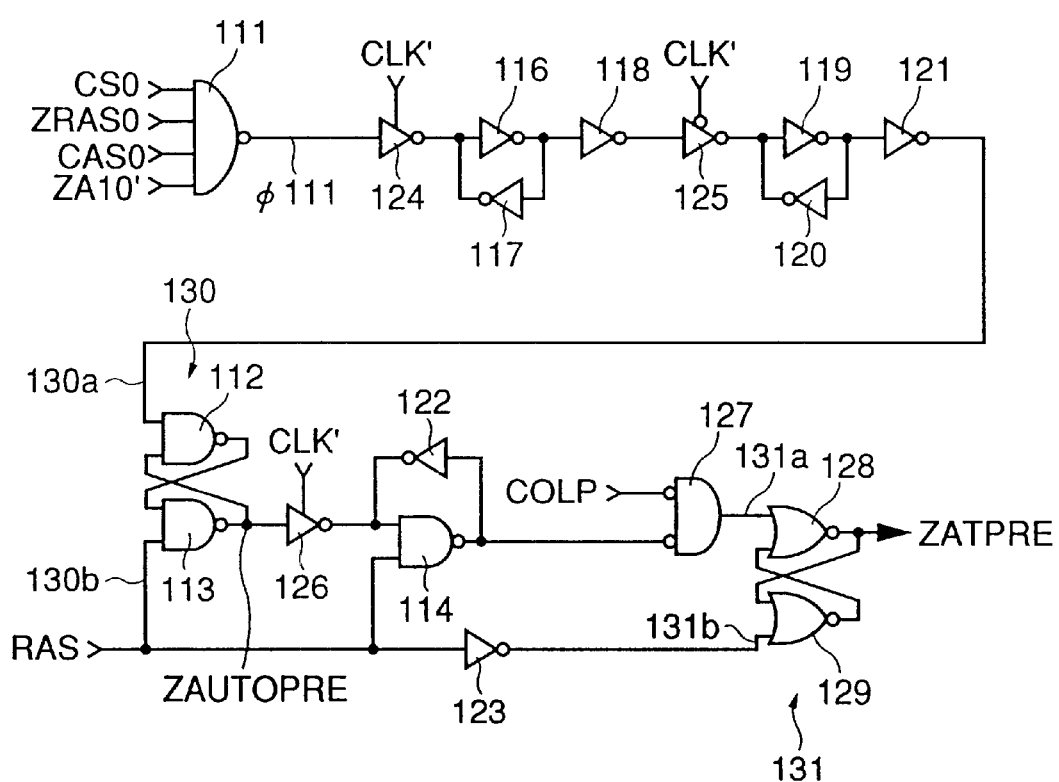
FIG. 10 is a circuit diagram showing another portion of the signal generation circuit included in the SDRAM described in conjunction with FIGS. 1A–1H.
Figure 11:
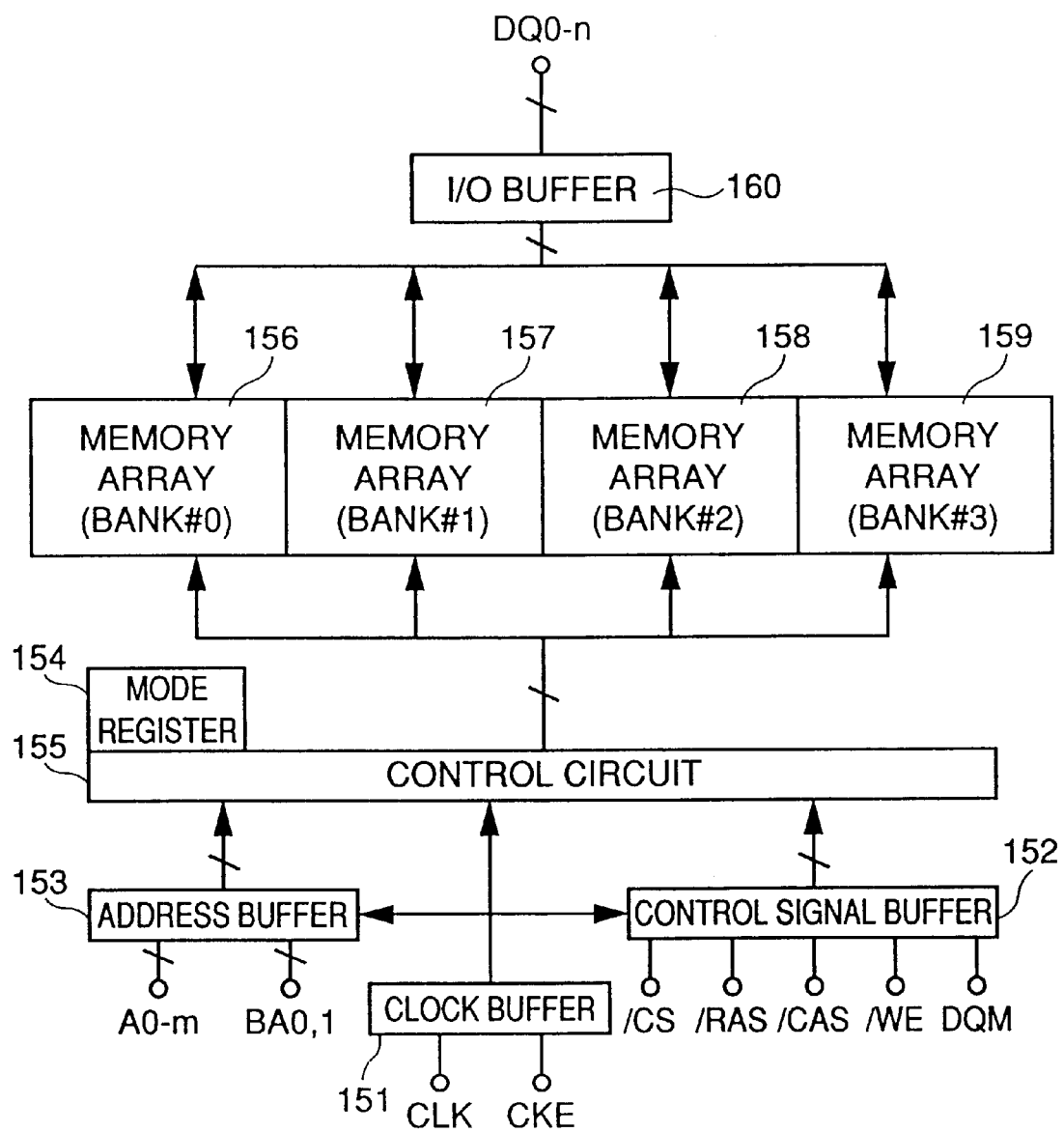
FIG. 11 is a block diagram showing a schematic configuration of a conventional SDRAM.
Figure 12:
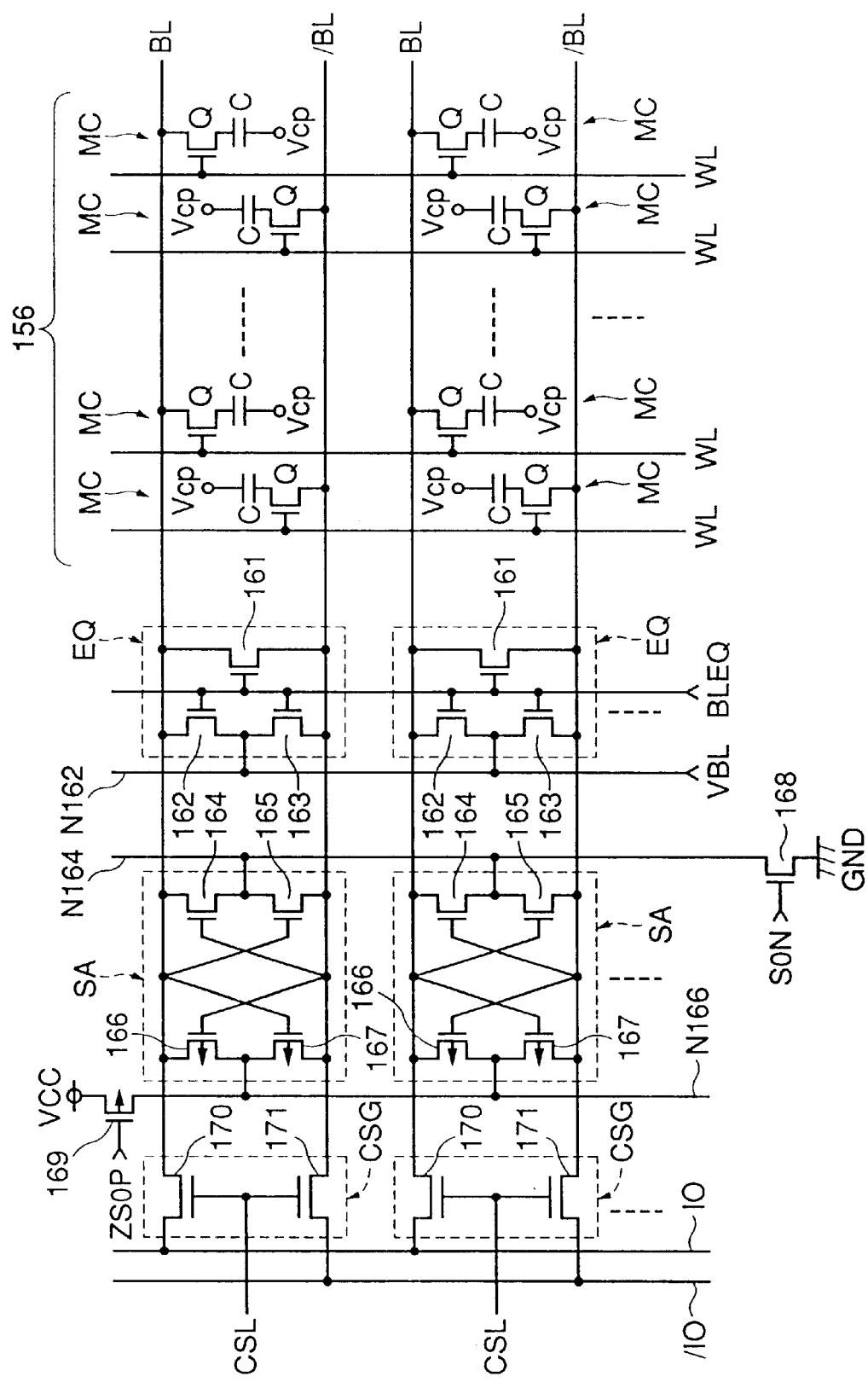
FIG. 12 is a circuit diagram showing a configuration of a portion of the FIG. 11 memory array and of a portion associated therewith.
Figure 13:
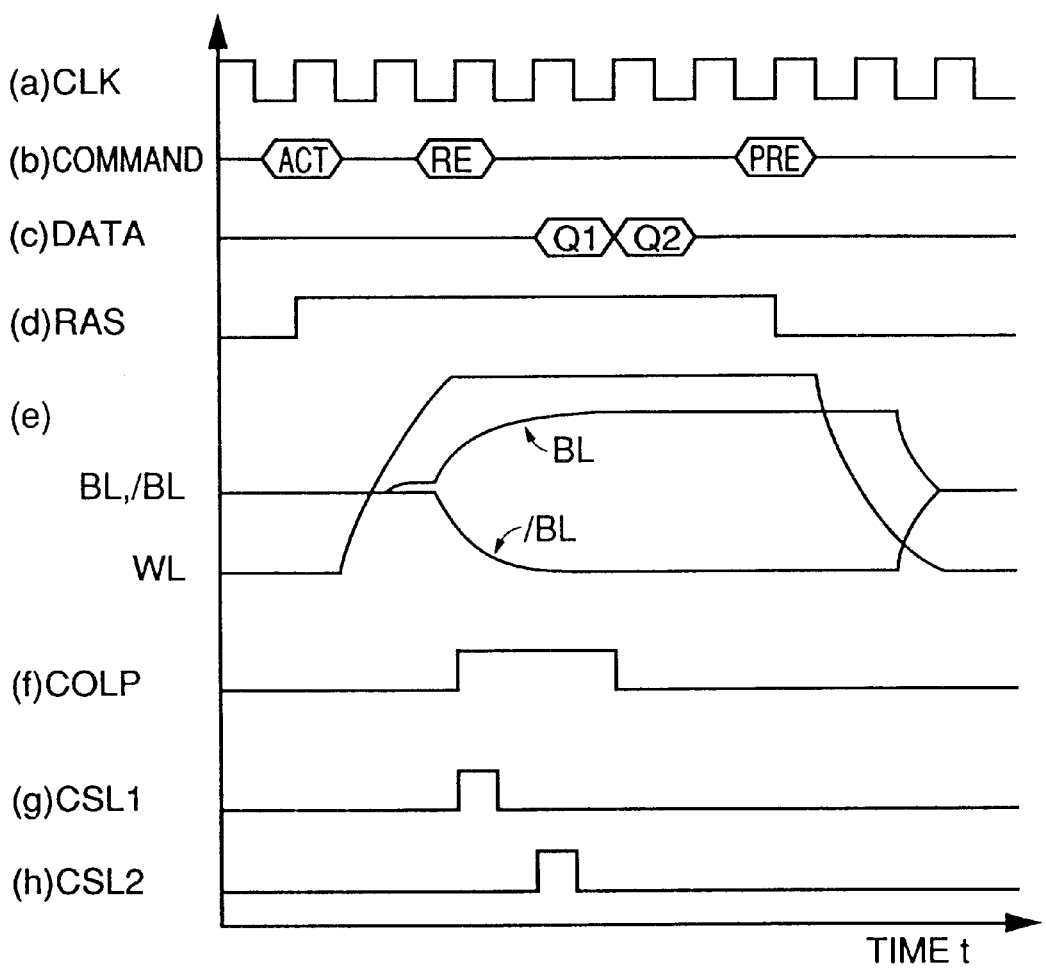
FIG. 13 is time plots representing a data read operation of the FIG. 11 SDRAM.
Figure 14:
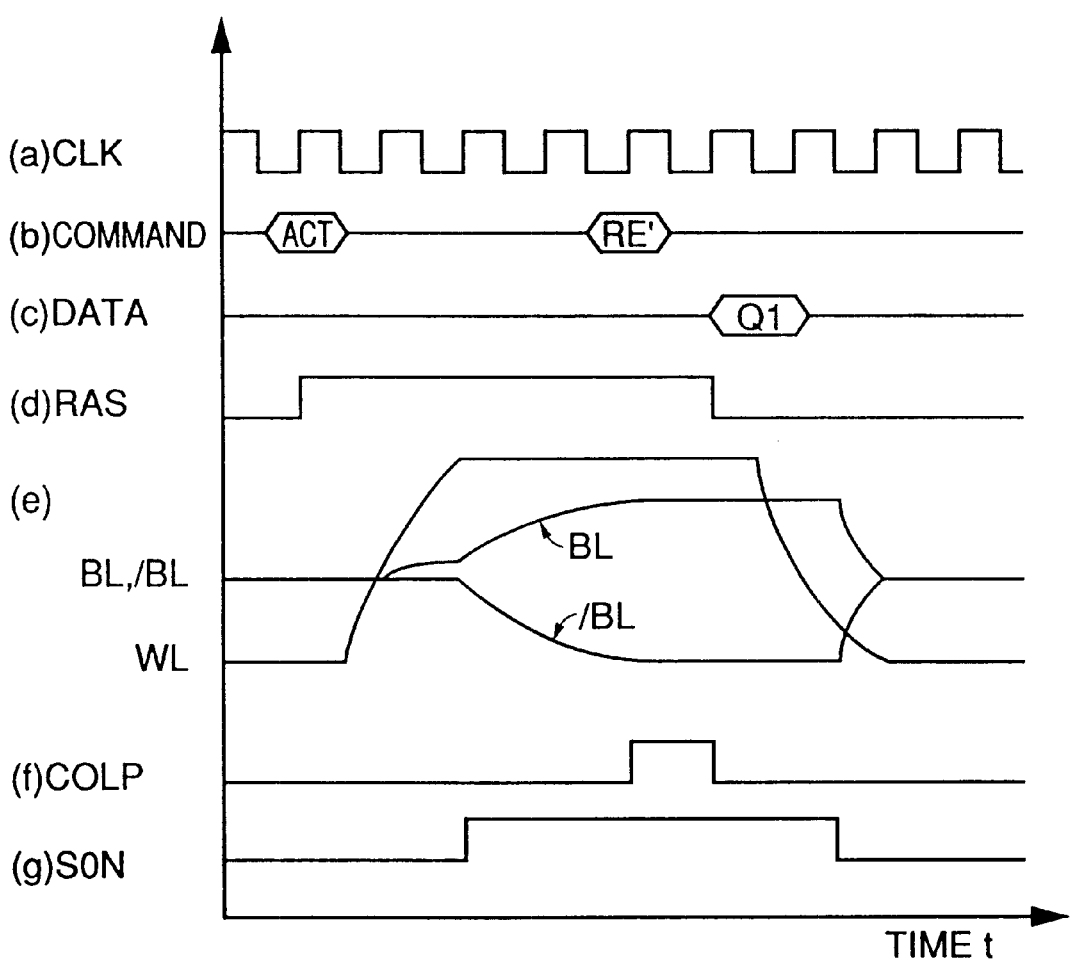
FIG. 14 is time plots representing another data read operation of the FIG. 11 SDRAM.

Furthermore, as shown in FIG. 10, the signal generation circuit includes NAND gates 111–114, inverters 116–123, clocked inverters 124–126 and NOR gates 127–129, and NAND gates 112, 113 and NOR gates 128, 129 respectively configure flip-flops 130, 131.

NAND gate 111 receives internal signals CS0, ZRAS0, CAS0, ZA10' and outputs a signal φ111 going active high when a read or write command with an auto-precharge function (/RAS is high, /CAS is low, /CS is low, A10 is high) is input.

Signal φ111 output from NAND gate 111 is input via clocked inverter 124, inverters 116, 118, clocked inverter 125 and inverters 119, 121 to flip-flop 130 at a reset terminal 130a. Inverters 116 and 117 are connected in antiparallel to configure a latch circuit. Inverters 119 and 120 are connected in antiparallel to configure a latch circuit.

Flip-flop 130 outputs a signal ZAUTOPRE which is in turn input via clocked inverter 126 to NAND gate 114 at one input node. Inverter 122 is connected between an output node of NAND gate 114 and an output node of clocked inverter 126.

NOR gate 127 receives signal COLP and a signal output from NAND gate 114. NOR gate 127 outputs a signal which is in turn input to flip-flop 131 at a set terminal 131a. Internal clock signal CLK' is input to clocked inverters 124–126 at a control node. Signal RAS is directly input to flip-flop 130 at a set terminal 130b and to NAND gate 114 at the other input node and is also inverted by inverter 123 and thus input to flip-flop 131 at a reset terminal 131b.

When read command RE' with the auto-precharge function is input, signal φ111 goes low and flip-flop 130 is reset and signal ZAUTOPRE goes low. As such, when burst operation completes and signal COLP goes low, flip-flop 131 is set and signal ZATPRE goes low and is input to the FIG. 9NOR gate 97.

If with signal ZATPRE going low signal ZS0D is held high, NOR gate 97 has an output unchanged, remaining low, and signal RAS is unchanged, held high. When sense amplifier SA is activated and predetermined period of time Td thereafter elapses and signal CS0D then goes low, NOR gate 97 has its output going high and flip-flop 108 is reset and signal RAS goes low.

As such, signal RAS can be prevented from going low when paired lines BL and /BL do not have a sufficiently amplified potential difference therebetween, to satisfactorily rewrite data into memory cell MC.

It is needless to say that with a write command with the auto-precharge function, introducing signal ZS0D allows data to be satisfactorily rewritten into memory cell MC with an associated word line WL selected but an associated pair of bit lines not selected. The other configurations and operations are the same as in a conventional SDRAM and a description thereof will not be repeated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a bit line pair;
   a word line;
   a memory cell coupled to said bit line pair and said word line;
   a sense amplifier for amplifying data on said bit line pair in response to a first signal activated in accordance with an active command; and
   a control circuit for resetting the first signal in response to an inactivation of a second signal which is activated for a period of time according to a burst length and a passage of a predetermined period of time after the first signal is activated.

2. The semiconductor device according to claim 1, wherein said control circuit resets the first signal in response to the inactivation of the second signal and the passage of the predetermined period of time when a read/write command with an auto precharge is supplied, and resets the first signal in response to a precharge command when a read/write command without the auto precharge is supplied.

3. The semiconductor device according to claim 1, wherein said word line is activated in response to the first signal.

* * * * *